(12) United States Patent
Ying et al.

(10) Patent No.: US 11,437,297 B2
(45) Date of Patent: Sep. 6, 2022

(54) MODERATED DEFORMATION OF A VAPOR CHAMBER TO MATCH A SHAPE OF A HEAT SOURCE

(71) Applicant: Intel Corporation, Santa Clara, CA (US)

(72) Inventors: Guoliang Ying, Shanghai (CN); Jun Lu, Shanghai (CN); Guangying Zhang, Shanghai (CN); Xinglong Xu, Shanghai (CN); Wei Liao, Shanghai (CN); Fangbo Zhu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/255,415

(22) PCT Filed: Sep. 28, 2018

(86) PCT No.: PCT/CN2018/108161
§ 371 (c)(1),
(2) Date: Dec. 22, 2020

(87) PCT Pub. No.: WO2020/061976
PCT Pub. Date: Apr. 2, 2020

(65) Prior Publication Data
US 2021/0280496 A1    Sep. 9, 2021

(51) Int. Cl.
*H01L 23/40*    (2006.01)
*H01L 23/02*    (2006.01)
(Continued)

(52) U.S. Cl.
CPC .......... *H01L 23/4006* (2013.01); *H01L 21/50* (2013.01); *H01L 23/02* (2013.01);
(Continued)

(58) Field of Classification Search
CPC ... H01L 23/4006; H01L 23/02; H01L 23/367; H01L 23/562; H01L 21/50; H01L 2924/3511
See application file for complete search history.

(56) References Cited

U.S. PATENT DOCUMENTS 8,176,972 B2 * 5/2012 Mok ................... H01L 23/4332
165/104.33
2003/0024698 A1    2/2003 Bosak, III
(Continued)

FOREIGN PATENT DOCUMENTS

CN    2758975 Y    2/2006

OTHER PUBLICATIONS

International Search Report and Written Opinion for International Patent Application No. PCT/CN2018/108161 dated Jun. 27, 2019, 10 pgs.

*Primary Examiner* — Peniel M Gumedzoe
(74) *Attorney, Agent, or Firm* — Schwabe, Williamson & Wyatt P.C.

(57) ABSTRACT

Systems, apparatuses, processes, and techniques are provided which are related to a vapor chamber (750) having a first side and a second side opposite the first side, where the first side is to thermally couple to a heat sink (708) and the second side to thermally couple to a heat source. The vapor chamber (750) may include a compressible mechanism disposed within the vapor chamber (750) coupled with the first side and the second side where the second side, when coupled to the heat source, is to deform at least partially to match a shape of the heat source. The compressible mechanism within the vapor chamber (750) may moderate the deformation of the second side.

19 Claims, 14 Drawing Sheets

(51) Int. Cl.
    *H01L 23/00*     (2006.01)
    *H01L 21/50*     (2006.01)
    *H01L 23/367*    (2006.01)

(52) U.S. Cl.
    CPC .......... *H01L 23/367* (2013.01); *H01L 23/562* (2013.01); *H01L 2924/3511* (2013.01)

(56) References Cited

U.S. PATENT DOCUMENTS

| | | |
|---|---|---|
| 2008/0053640 A1 | 3/2008 | Mok |
| 2010/0319881 A1 | 12/2010 | Wang |
| 2010/0326630 A1 | 12/2010 | Wang |
| 2016/0091260 A1* | 3/2016 | Schultz ................... F28F 3/022 165/185 |
| 2018/0240735 A1* | 8/2018 | Karidis ............... H01L 23/3677 |

* cited by examiner

MODERATED DEFORMATION OF A VAPOR CHAMBER TO MATCH A SHAPE OF A HEAT SOURCE

CROSS-REFERENCE TO RELATED APPLICATION

This patent application is a U.S. National Phase Application under 35 U.S.C. § 371 of International Application No. PCT/CN2018/108161, filed Sep. 28, 2018, entitled "MODERATED DEFORMATION OF A VAPOR CHAMBER TO MATCH A SHAPE OF A HEAT SOURCE," which designates the United States of America, the entire disclosure of which is hereby incorporated by reference in its entirety and for all purposes.

FIELD

Embodiments of the present disclosure generally relate to the field of package assemblies, and in particular package assemblies with vapor chambers.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size systems in package components that may result in package warpage.

DETAILED DESCRIPTION

Figure 1:
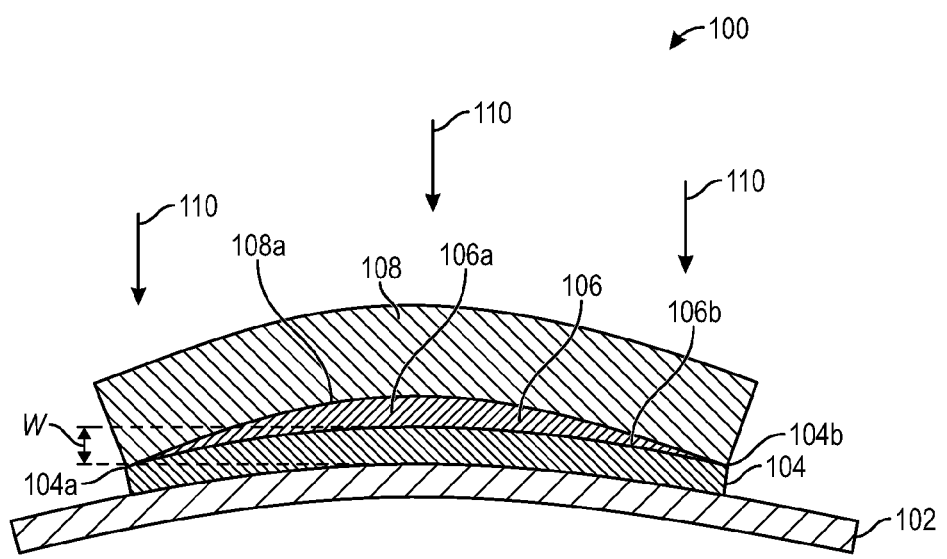
FIG. 1 illustrates an example integrated circuit (IC) package with a heat sink (HS) placing stress on the package, in accordance with embodiments.

Embodiments of the present disclosure may generally relate to a vapor chamber having a first side and a second side opposite the first side, where the first side is to thermally couple to a heat sink and the second side to thermally couple to a heat source. The vapor chamber may include a compressible mechanism disposed within the vapor chamber coupled with the first side and the second side where the second side, when coupled to the heat source, is to deform at least partially to match a shape of the heat source. The compressible mechanism within the vapor chamber may moderate the deformation of the second side.

As IC packages operate at ever higher power levels and at ever increasing power density, thermal management of the package and maximizing overall thermal performance to increase IC package and related PCB performance will continue to be an issue. For example, chip on wafer on substrate (COWOS) technology may have high cooling requirements, particularly when application-specific integrated circuits (ASIC) and/or high-bandwidth memory (HBM) are included. Many high-thermal producing implementations may include artificial intelligence or deep learning applications that may have higher than average power requirements.

Warpage with respect to these packages may be an issue. For example, after an IC package has been surface mounted onto a Peripheral Component Interconnect Express (PCIe) card, the resulting warpage may lead to a larger gap at IC package corners and thicker bunching of thermal interface material (TIM2) between the IC and the heatsink bond line thickness (BLT). There may also be a non-uniform preload distribution at the die surface area, which may result in lower thermal and reliability performance, particularly in consideration of the high power level of the package during operation.

Legacy implementations have partially addressed this issue by machining a HS base before applying the base to the IC package to better control HS base flatness for a better contact surface. Other implementations may have tried to machine a shape onto the HS base to match the package shape, or to increase the preload pressure on the HS to push the IC package back to flat. However, with these implementations, machining a HS base to be more flat may reduce BLT slightly, (for example, from 0.1 mm to 0.05 mm), but may not result in significant thermal improvement because the overall TIM2 LBT may still be quite high (for example, 0.2 mm). In addition, even if applying an extremely high load to the warped package, the increase of contact area between HS base and the package may be limited. It may be difficult to change a package shape after surface mounting, and may also lead to unexpected internal damage to the package.

In embodiments, a vapor chamber HS base, which may be formed fitted to an IC package, may significantly reduce TIM2 BLT at least four of the package corners. In embodiments, the vapor chamber base may be flat and deformable, convex, or some other shape. Preload distribution on a die surface attached to the package may therefore be more uniform in comparison to a solid HS base. In addition, TIM2 degradation may be significantly reduced, and the end-of-life TIM2 performance may be enhanced as well.

Embodiments described herein may address thermal management of packages that have warpage issues without adding complicated package design changes. In addition, embodiments may have 10° C. or more thermal benefit during operation, which may significantly enhance IC package performance and reliability.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

FIG. 1 illustrates an example integrated circuit (IC) package with a heat sink (HS) placing stress on the package, in accordance with embodiments. Diagram 100 shows a substrate 102 with a die 104 coupled with the substrate 102, which may be warped in at least one direction by a distance of W. As a result, a side of the die 104 not coupled to the substrate 102 may also have a similar warpage. A TIM 106 may be physically and thermally coupled to the die 104. A heat sink base 108 may be physically and thermally coupled to the TIM 106 and/or the die 104.

In embodiments, a side 108a of the heat sink 108 that may be in contact with the TIM 106 and/or the die 104 may have been machined prior to assembly to compensate for the warpage of the die 104. However, if the compensation in the heat sink side 108a is not exact, applying a force 110 onto the heatsink 108 may cause the TIM 106 to bunch up in a first area 106a and to thin out in a second area 106b, which may result in thermal transfer inefficiencies. In addition, applying the force 110 may also result in points 104a, 104b applying high pressure to the die 104. This may result in chipping and/or cracking of the die 104, and may result in operational failures of the die 104.

Figure 2A:
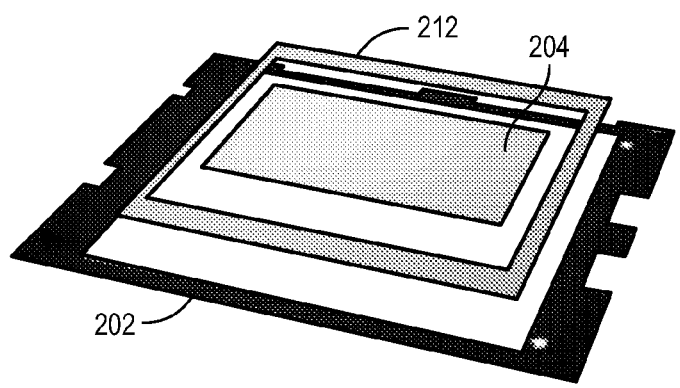
FIGS. 2A-2D illustrate IC package warping issues with respect to a printed circuit board (PCB), stiffener, and die, in accordance with embodiments.
Figure 2B:
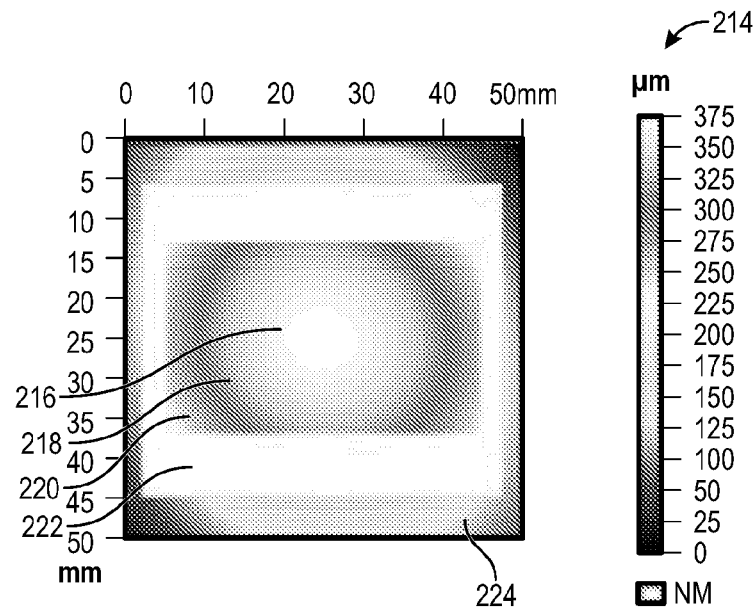

FIGS. 2A-2D illustrate IC package warping issues with respect to a printed circuit board (PCB), stiffener, and die, in accordance with embodiments. FIG. 2A illustrates a perspective view of components of an IC package with a stiffener. This includes a PCB 202 (which may, for example, be a PCIe card) and a die 204, which may be similar to substrate 102 and die 104 of FIG. 1, and a stiffener 212, which may be a rigid HS base. The components may be assembled in a way so that the stiffener 212 may modify any warpage of the die 204 or PCB 202. FIG. 2B shows a top-down view of the IC package shown in FIG. 2A and gradients 214 that represent movements in micrometers (μm) as a force is applied by the stiffener 212 toward the PCB 202. In tests, region 216 of the die 204 showed very little deformation, region 218 showing more deformation, and region 220 showing the most deformation. The region 222 corresponding to the stiffener 212 shows a constant level of deformation. The region 224, which corresponds to the PCB 202, shows very little deformation.

Figure 2C:
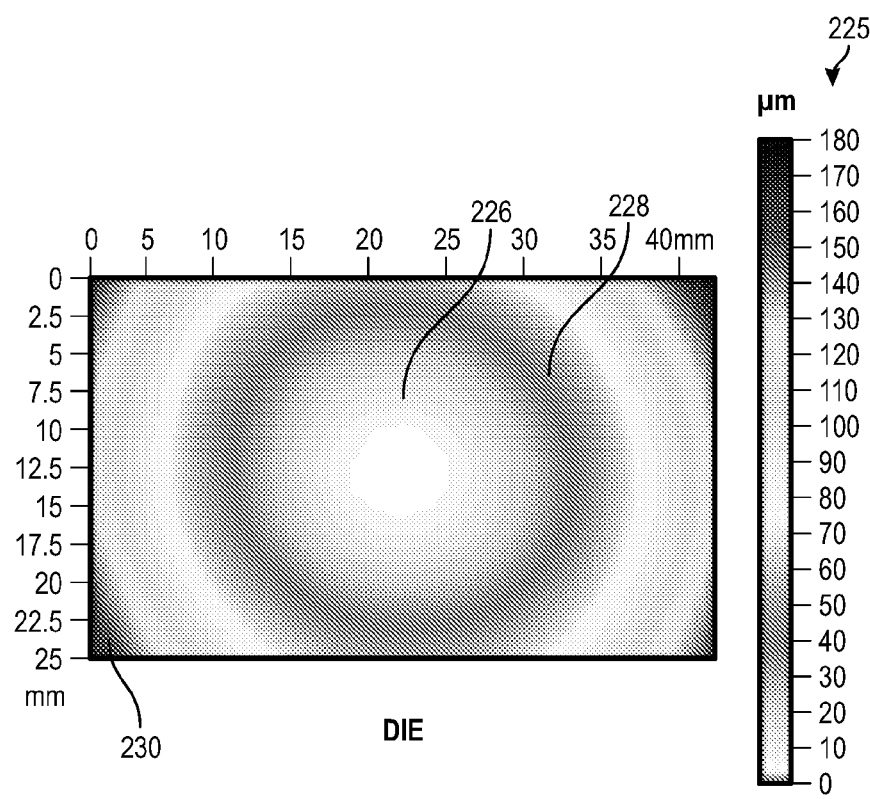
Figure 2D:
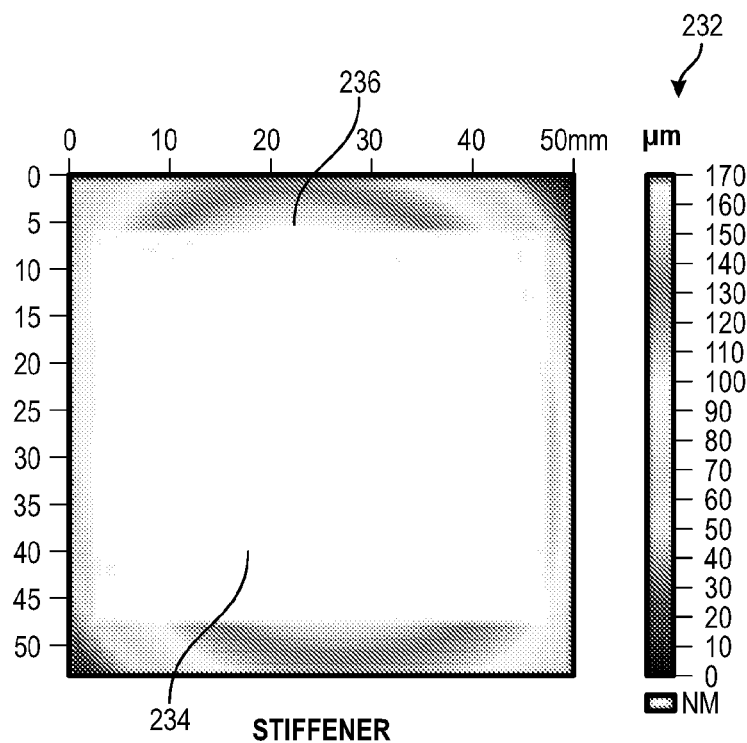

FIG. 2C shows a top-down view of the die 204 mounted to the PCB 202 with gradients 225 applied that represent movements in μm. Region 226, near the center of the die, shows the greatest area of deformation, with region 228 and region 230 showing progressively less deformation moving toward the outside of the die 204. FIG. 2D shows a stiffener applied to the PCB 202, with gradients 232 applied that represent movements in μm. Region 234 corresponding to the stiffener 212 shows a constant level of deformation. Various regions 236 of the PCB 202, however, show a variety of different deformations throughout the PCB 202.

In embodiments, table 1 shows examples of warpages observed in different configurations of PCBs 202, dies 204, and stiffeners 212.

TABLE 1

Examples of Package Warpages

|  | Warpage Die | Warpage stiffener | Peak to Peak Die to stiffener | Peak to Peak Die to PCB |
|---|---|---|---|---|
| Sample No. 1 | 183 | 178 | 207 | 3390 |
| Sample No. 2 | 203 | 141 | 219 | 3390 |

Figure 3:
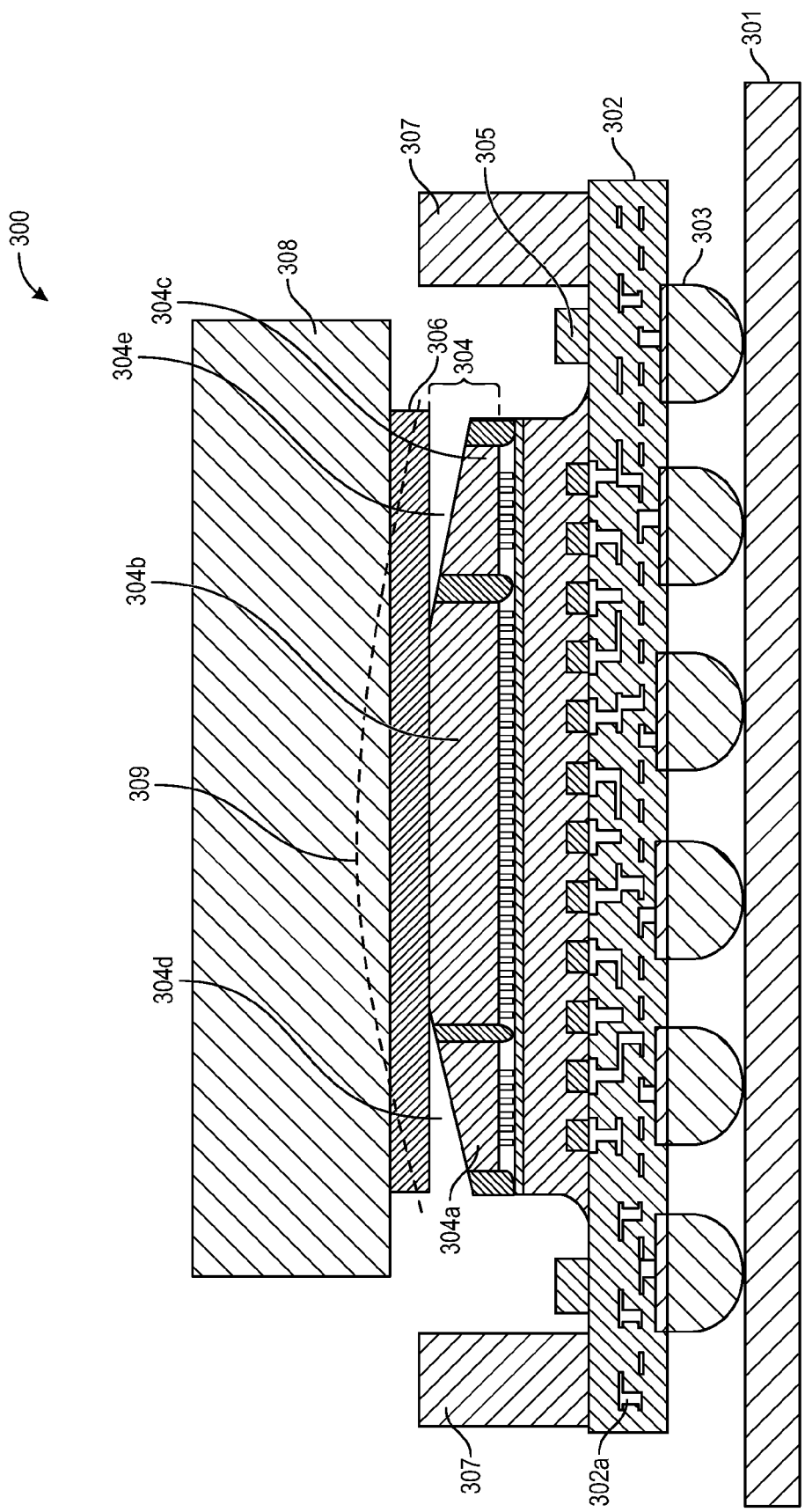
FIG. 3 illustrates a side view of an IC package with an HS base applied, in accordance with embodiments.

FIG. 3 illustrates a side view of an IC package with an HS base applied, in accordance with embodiments. Diagram 300 shows PCB 301 that is coupled with a substrate 302, which may be similar to substrate 102 of FIG. 1, by solder balls 303. A die 304, which may be similar to die 104 of FIG. 1, may be coupled to the substrate 302. In embodiments, the substrate 302 may have one or more routing elements 302a within various layers. The substrate 302 may also have other elements, such as passive elements 305 coupled with the substrate 302. In embodiments, structural elements 307 may be coupled to the substrate 302 to support securing of a HS base 308, which may be similar to HS 108 of FIG. 1, as described in more detail below.

The die 304 may be thermally coupled with the HS base 308 using a TIM2 material 306, which may be similar to TIM material 106 of FIG. 1. In embodiments, the die 304 may be multiple separated dies such as HBM dies 304a, 304c and ASIC die 304b. As shown, the die 304 may have some warpage resulting in areas 304d, 304e that separate the HS base 308 from the die 304. As a result, less than 100% of the area of the surface of the die 304 is in direct physical contact with the HS base 308.

The dashed line 309 may represent a deformation of the HS base 308 that, if allowed to deform, would fit the shape of the die 304 and would form a tight physical coupling and a more efficient thermal coupling.

Figure 4:
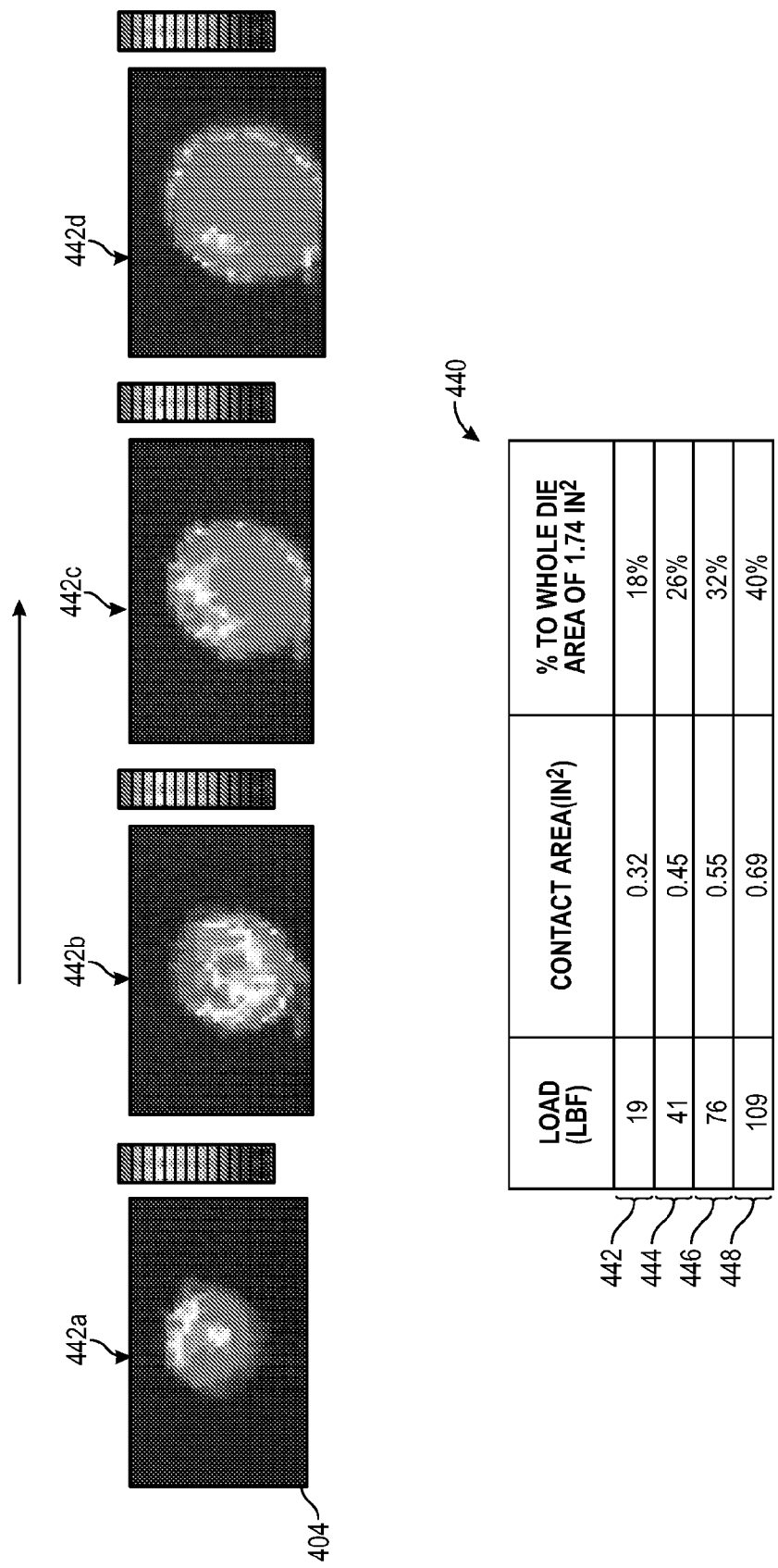
FIG. 4 illustrates the effect of increased load between an HS base and IC package on IC package warpage, in accordance with embodiments.

FIG. 4 illustrates the effect of increased load between an HS base and IC package on IC package warpage, in accordance with embodiments. Table 440 shows test results from four examples 442, 444, 446, 448 of different loads (in foot-pounds) that may be applied to the heatsink base 308 of FIG. 3, and the resulting contact area (in terms of a contact area in square inches and a percentage of the whole die area) between the HS base 308 and/or TIM 306, and the die 304.

With respect to example 442, a 19 foot-pound load put on the HS base 308 resulted in a 0.32 sq. in., or 18% contact with the die 304, as may be outlined in pictures 442a-442d by die image 404. With respect to example 444, a 41 foot-pound load put on the HS base 308 resulted in a 0.45 sq. in., or 26% contact with the die 304. With respect to example 446, a 76 foot-pound load on the HS base 308 resulted in a 0.55 sq. in., or 32% contact with the die 304. Finally, with respect to example 448, a 109 foot-pound load on the HS base 308 resulted in a 0.69 sq. in., or 40% contact with the die 304.

These test results indicate that even when applying a load from a typical 10 foot-pounds to an extremely high 100 foot-pounds (10×), the increase of contact area between the HS base 308 and the die 304 is very limited. Both the HS base 308 and the die 304/substrate 302 are solid and will not easily change shape. In addition, in legacy implementations a HS base 308 may typically be very thick (greater than 4 mm) with enough stiffness to survive a high load requirement (such as around 200 foot-pounds), limiting the deformation possibilities in such a HS base 308. Thus, it may be difficult to prove package warpage as described for FIG. 4. This may be true in particular for dies 304 that have HBMs 304a, 304c with respective spaces 304d, 304e above them, that with a much larger TIM2 BLT that may lead to a max ~10° C. Tj higher on the die when there are four HBMs at each corner which may form a thermal bottleneck.

Table 2 shows various measurements with respect to warpage and non-warpage packages.

Figure 5A:
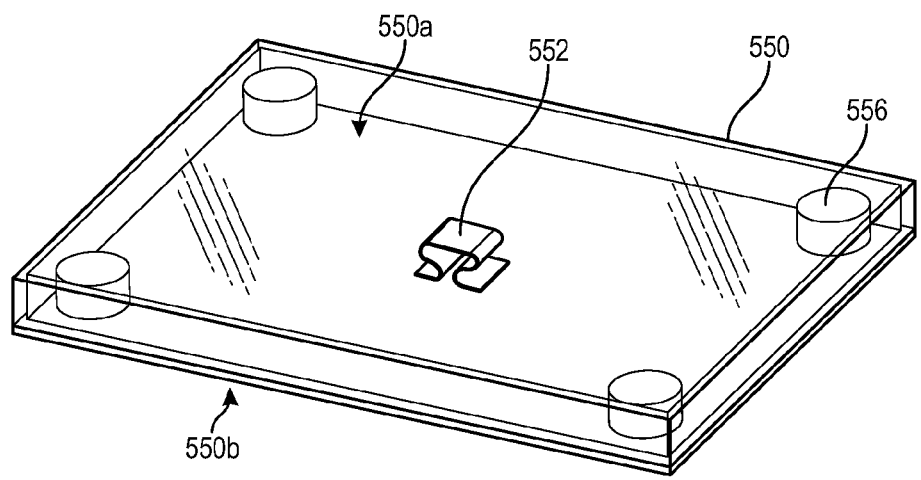
FIGS. 5A-5C illustrates multiple views and an explosion diagram of a HS vapor chamber with a spring to support limited vapor chamber deformation, in accordance with embodiments.
Figure 5B:
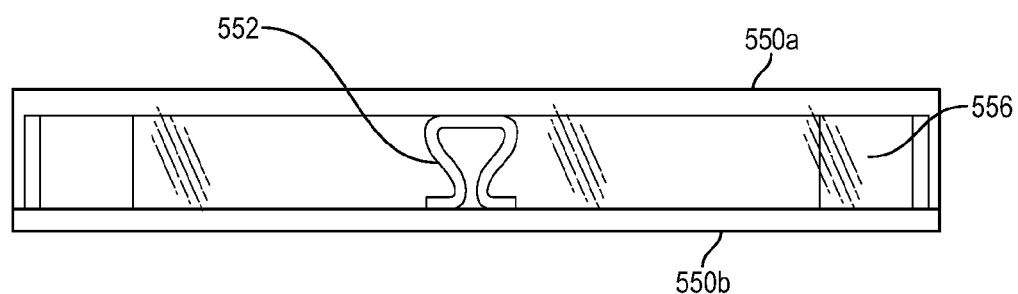
Figure 5C:
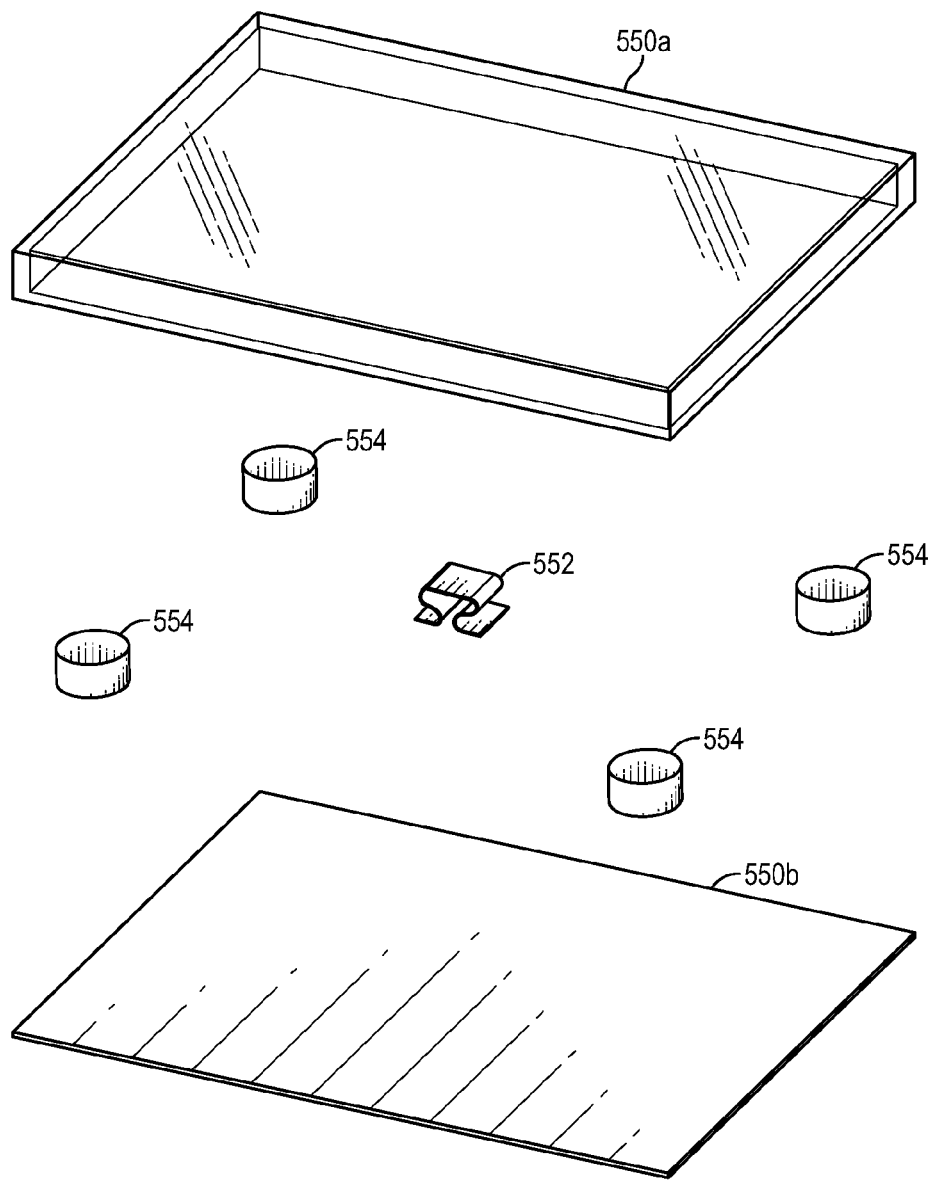

FIGS. 5A-5C illustrates multiple views and an explosion diagram of a HS vapor chamber with a spring to support limited vapor chamber deformation, in accordance with embodiments. FIG. 5A shows a perspective view of a vapor chamber 550. In embodiments, vapor chamber 550 may be similar in some respects to HS base 308 of FIG. 3. In embodiments, vapor chamber 550 may be coupled with an HS base 308. The vapor chamber 550 may have a top side 550a and a bottom side 550b. The top side 550a may be coupled to a HS base 308, and the bottom side 550b may be coupled to an IC package that may be warped, or in particular to an IC die 304.

In embodiments, the vapor chamber 550 may be hollow and may include a liquid, a vapor, or both. The vapor chamber bottom 550b may be less stiff and/or rigid than the HS base 308. The vapor chamber bottom 550b may be made, in non-limiting examples, from copper (Cu) or aluminum (Al). As a result, when a specific load is applied to the vapor chamber bottom 550b, against a package or a die such as die 304 that is warped, the vapor chamber bottom 550b in contact with the die 304 may be bended and deformed to the shape of the surface of the die 304. As a result, a greater surface area of contact may be formed between the vapor chamber bottom 550b and the die 304. This is discussed further with respect to FIG. 8.

As the vapor chamber bottom 550b deforms to form to the shape of the die 304 of FIG. 3, it is possible that the vapor chamber 550 may deform too much and result in a loss of vapor chamber integrity. For example, a side of the vapor chamber 550 may rupture, or the vapor chamber top 550a and the vapor chamber bottom 550b may touch, reducing the effectiveness of the vapor chamber and/or preventing a flow of coolant and/or vapor to absorb thermal energy from the die 304.

To guard against a loss of vapor chamber 550 integrity, a spring 552 may be positioned between the vapor chamber top 550a and the vapor chamber bottom 550b. In embodiments, the spring 552 may be positioned at or near the center of the vapor chamber 550. In embodiments, there may be multiple springs 552 positioned throughout the vapor chamber 550.

In embodiments, one or more springs 552 may be of varying shapes, for example, springs 552 may be compression springs including: a coil shape, conical shape, hourglass shape, barrel shape, wave spring, or the like. The one or more springs 552 may be other structures, metallic, nonmetallic, or both, that may partially but not completely collapse when put under compression.

As shown in FIGS. 5B-5C, supports 556 may be placed within the vapor chamber 550. In embodiments, the supports 556 may be positioned to physically couple with the vapor chamber top 550a and the vapor chamber bottom 550b. The supports 556 may be rigid and/or non-compressible to provide support to maintain a spacing proximate to the vapor chamber top 550a and the vapor chamber bottom 550b. The

TABLE 2

|  | M2 | M4 | M6 | D1 | D2 | D3 | D4 | D5 | D6 | D7 | D8 | D9 | D10 |
| --- | --- | --- | --- | --- | --- | --- | --- | --- | --- | --- | --- | --- | --- |
| Non-warpage | 79.1 | 77.8 | 80.0 | 71.1 | 74.9 | 72.8 | 75.6 | 79.6 | 79.9 | 73.4 | 76.8 | 80.0 | 76.3 |
| warpage | 89.1 | 77.7 | 79.1 | 71.8 | 73.5 | 80.5 | 83.3 | 80.5 | 81.1 | 72.7 | 80.2 | 79.9 | 85.5 |
|  | 10.0 | −0.1 | −0.9 | 0.8 | −1.4 | 7.7 | 8.0 | 0.9 | 1.3 | −0.7 | 3.4 | −0.1 | 9.0 | supports 556 may be round (as shown) or maybe in another shape such as square, rectangular, oblong, elliptical, and the like. The diameter of the supports 556 may be varied depending upon the support needs of the vapor chamber 550 proximate to the supports 556.

In embodiments, there may be a hole (not shown) through the supports 556 to allow a fastener to pass through the vapor chamber top 550a, a support 556, and the vapor chamber bottom 550b. In this way, a fastener (not shown) may be used to attach a HS 308 of FIG. 3 to the vapor chamber 550 through the support 556 and to a substrate 302, to apply pressure to the vapor chamber bottom 550b to cause it to deform and conform to a shape of the die 304.

Figure 6:
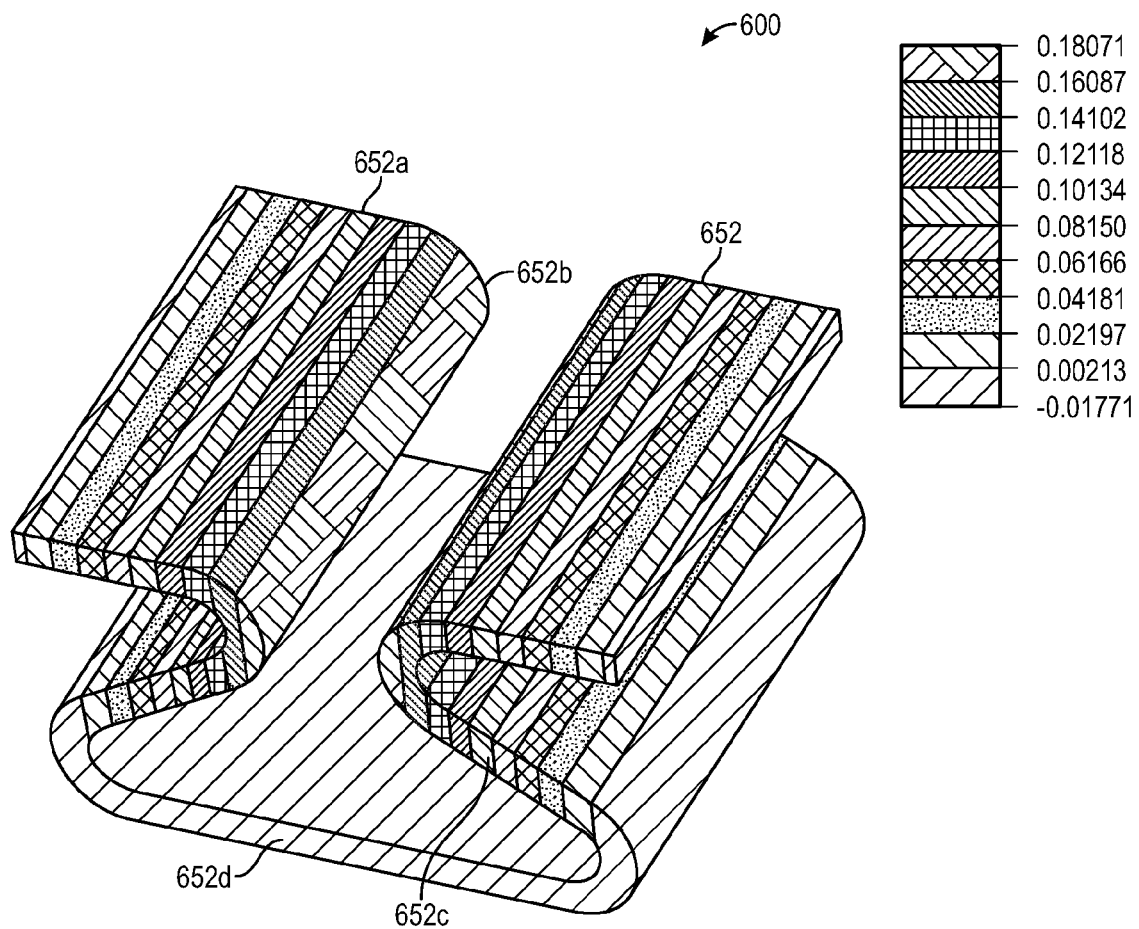
FIG. 6 illustrates details of a vapor chamber spring to support limited deformation, in accordance with embodiments.

FIG. 6 illustrates details of a vapor chamber spring to support limited deformation, in accordance with embodiments. Diagram 600 shows a spring 652 that may be similar to spring 552 of FIG. 5C. Diagram 600 shows a displacement for various regions, for example regions 652a-652d of the spring 652. An analysis of these displacement values may indicate an overall displacement value for the spring 652. For example, an analysis may indicate that the maximum displacement that may be reached by the spring may be 0.26 mm, which may cover a package warpage range of 0.2 mm.

Figure 7A:
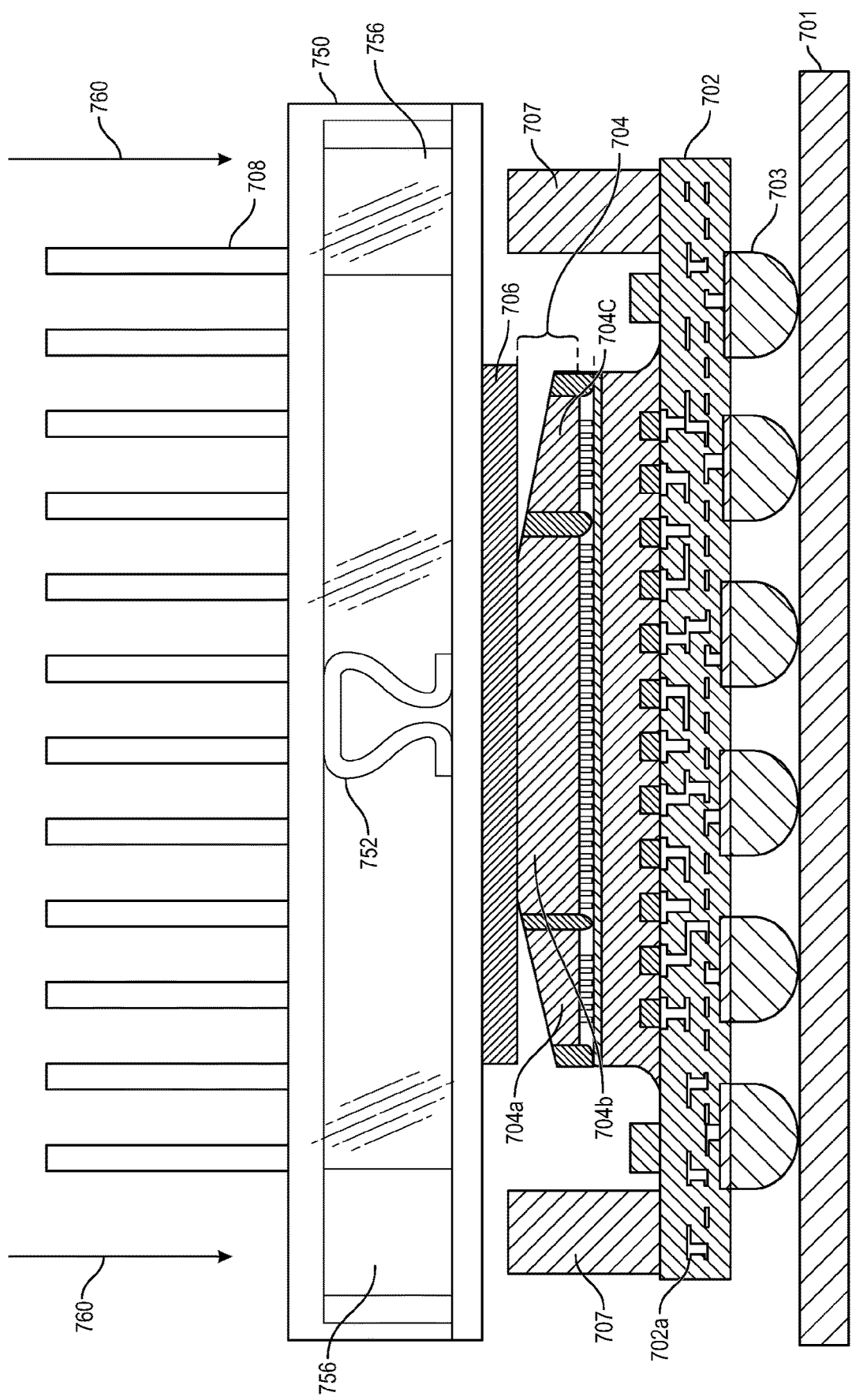
FIG. 7A-7B illustrate details of a heatsink that includes a vapor chamber spring to support limited deformation with an IC package, in accordance with embodiments.
Figure 7B:
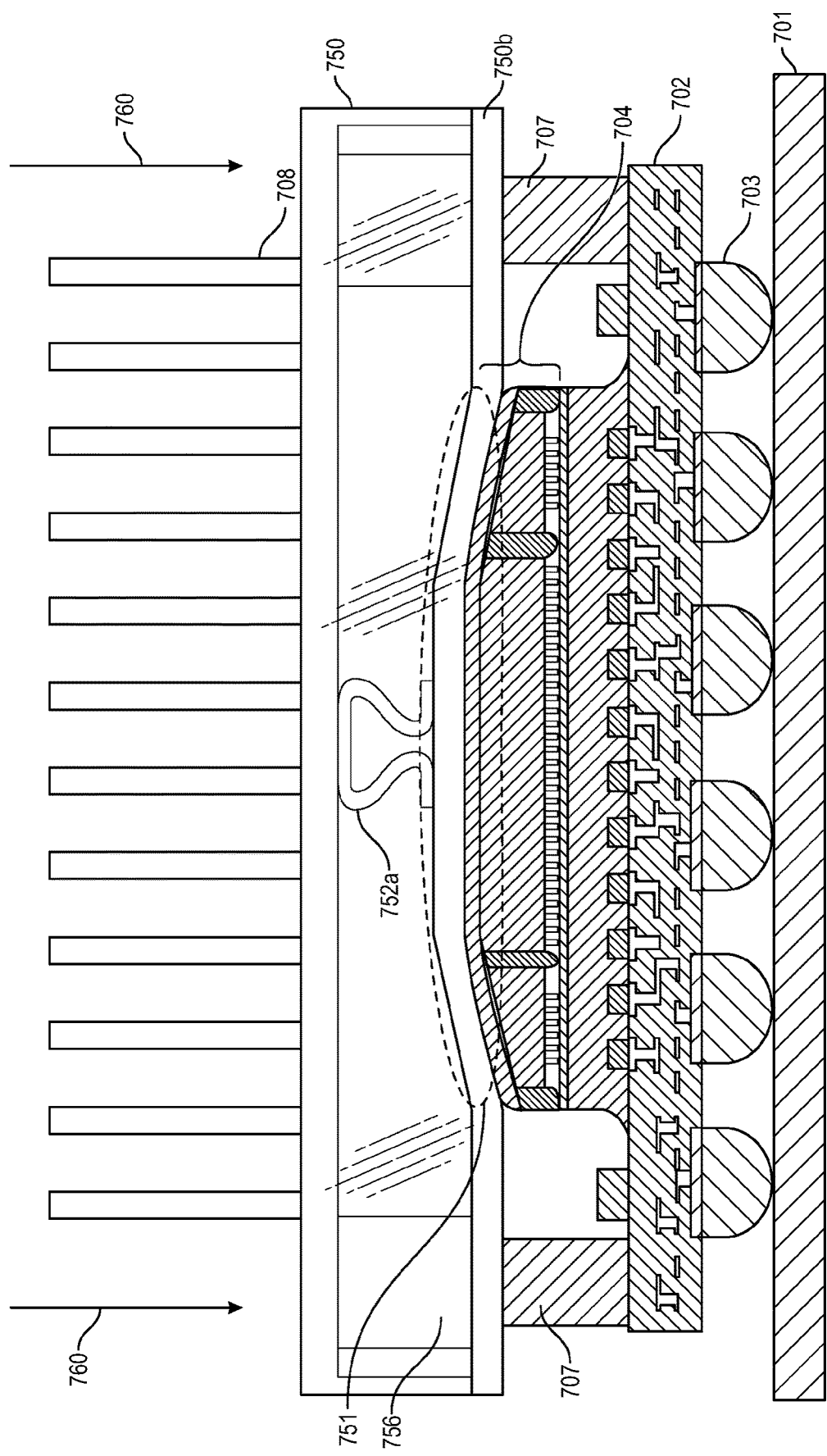

FIGS. 7A-7B illustrate details of a heatsink that includes a vapor chamber spring to support limited deformation with an IC package, in accordance with embodiments. FIG. 7A shows, prior to assembly, a vapor chamber 750, that includes a spring 752 and supports 756, which may be similar to vapor chamber 550, springs 552 and supports 556 of FIGS. 5A-5C, thermally and physically coupled with heatsink 708, which may be similar to heatsink 108 of FIG. 1.

Vapor chamber 750 may be to be physically and/or thermally coupled with a die 704, which may be similar to die 304 of FIG. 3. A TIM2 706, which may be similar to TIM2 306 of FIG. 3, may be positioned between the vapor chamber 750 and the die 704.

The die 704 may include a plurality of dies such has HBMs 704a, 704c and ASIC 704b In embodiments, the ASIC 704b may be one or more processors and/or multicore processors. The die 704 may be coupled to a substrate 702, which may be similar to substrate 302 of FIG. 3. The substrate 702 may have one or more routing elements 702a, which may be similar to routing elements 302a of FIG. 3, within various layers. The substrate 702 may be connected to a PC board 701 via solder balls 703.

In embodiments, structural elements 707 may be coupled to the substrate 702 to support securing of the vapor chamber 750 to the die 704. The securing of the vapor chamber 750 to the die may involve a preload force 760 applied to the vapor chamber 750, in particular to the area proximate to the supports 756.

FIG. 7B shows, after assembly that couples the heatsink 750 to the die 704. The vapor chamber bottom 750b has been deformed in the area 751 to take the shape of the die 704. The compressed spring 752a has limited the deformation so that the integrity of the vapor chamber 750 is still intact, while maximizing the contact of the surface area of the bottom of the vapor chamber 750b with the die 704. In embodiments, a portion of the vapor chamber bottom proximate to supports 756 may be in physical contact with the structural elements 707. In embodiments, a fastener (not shown) may pass through the supports 756 and secure into the structural elements 707.

In embodiments, the fasteners (not shown) may be spring screws. During assembly, a preload may be applied by a retention mechanism using, for example, spring screws (not shown) at the supports 756. In embodiments, this may control a specific load force of the vapor chamber bottom 750b against the die 704. The resulting deformation 751 may be adjusted by adjusting spring 752a shape or other attributes such as type of metal alloy, size, and the like. As a result, the vapor chamber bottom 750b may substantially take the shape of the surface of die 704.

Figure 8A:
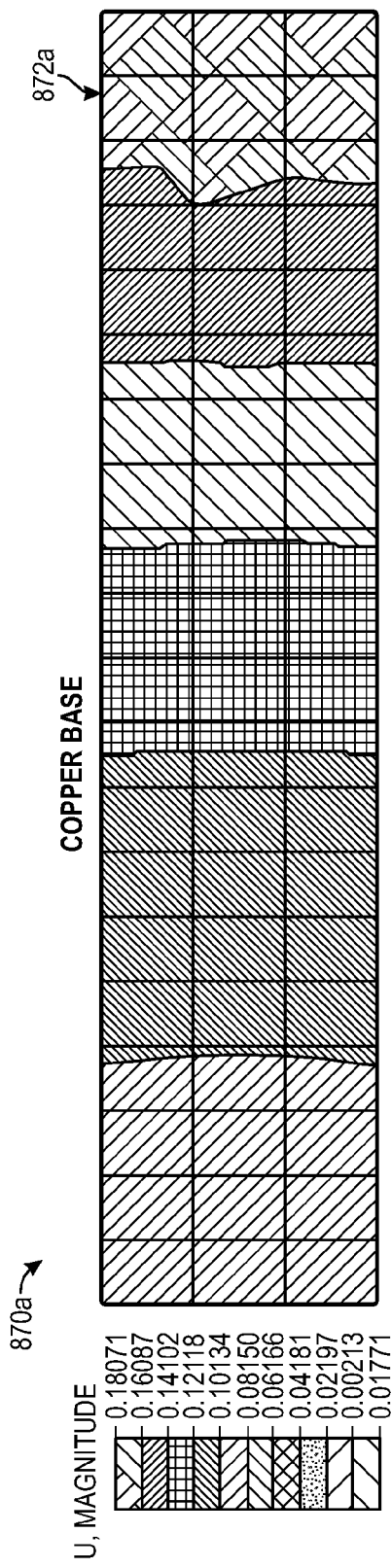
FIGS. 8A-8C illustrates example finite element analysis to determine reactions to assembly forces, in accordance with embodiments.
Figure 8B:
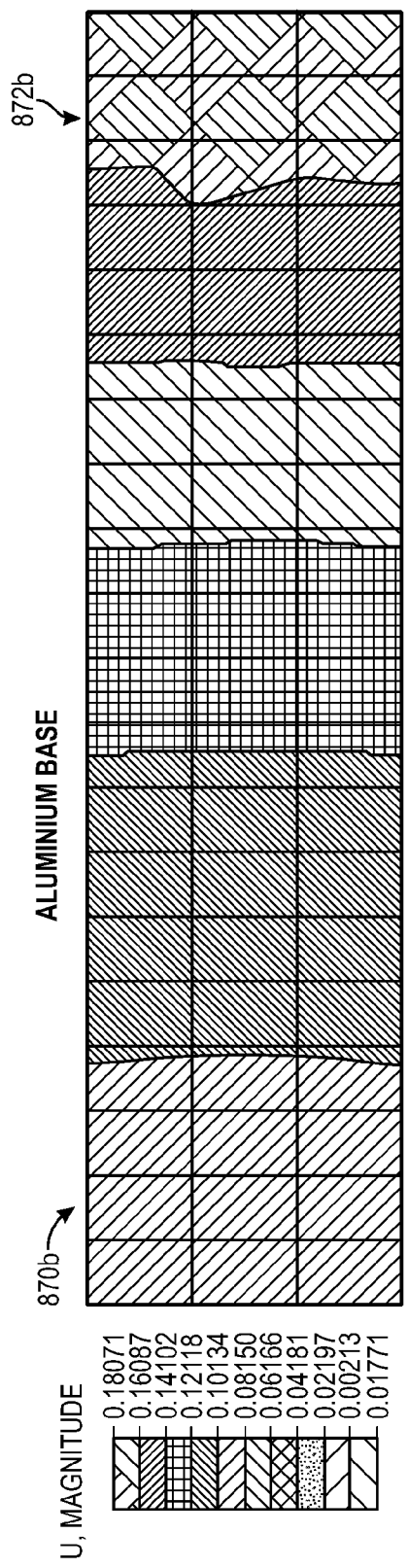
Figure 8C:
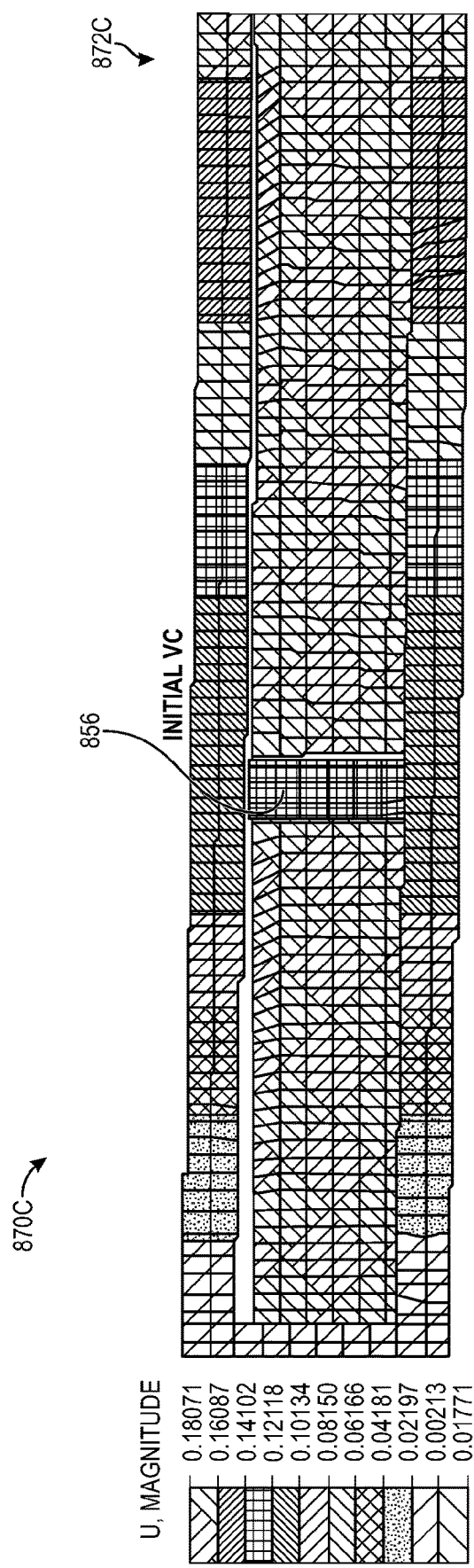

FIGS. 8A-8C illustrates example finite element analysis to determine reactions to assembly forces, in accordance with embodiments. The results of experimental tests of some of the implementations/embodiments described herein are described below. These results show the comparison of deformations of material placed across a die, such as die 704 of FIG. 7, from the die center which may be at the highest point with respect to the die height, to the edge of the die, which may be at the lowest point with respect to the die height.

FIG. 8A shows an increasing displacement for an copper base moving from the center of the die 870a to the edge of the die 872a, where 13 foot-pounds of force is applied to the copper base. The displacement shown for copper is approximately 38 μm.

FIG. 8B shows an increasing displacement for an aluminum base moving from the center of the die 870b to the edge of the die 872b, where 13 foot-pounds of force is applied to the aluminum base. The displacement shown for aluminum is approximately 70 μm, which is better than copper. However, aluminum has a drawback of a lower thermal conductivity.

FIG. 8C shows an increasing displacement for a vapor chamber moving from the center of the die 870c to the edge of the die 872c, where 13 foot-pounds of force is applied to the vapor chamber to cause it to deform. The displacement is more consistent throughout the vapor chamber, except for a location of a support 856, which may be similar to support 556 of FIG. 5, that may support the upper and lower sides of the vapor chamber.

Experiments using a vapor chamber, showed the largest displacement reach of 380 um, which may allow it to accommodate package warping conditions of over 150 μm. This may be adjustable by using varying thicknesses and copper column pattern designs.

Under operation, the displacement value may get smaller due to other elements stiffness compromise.

Figure 9:
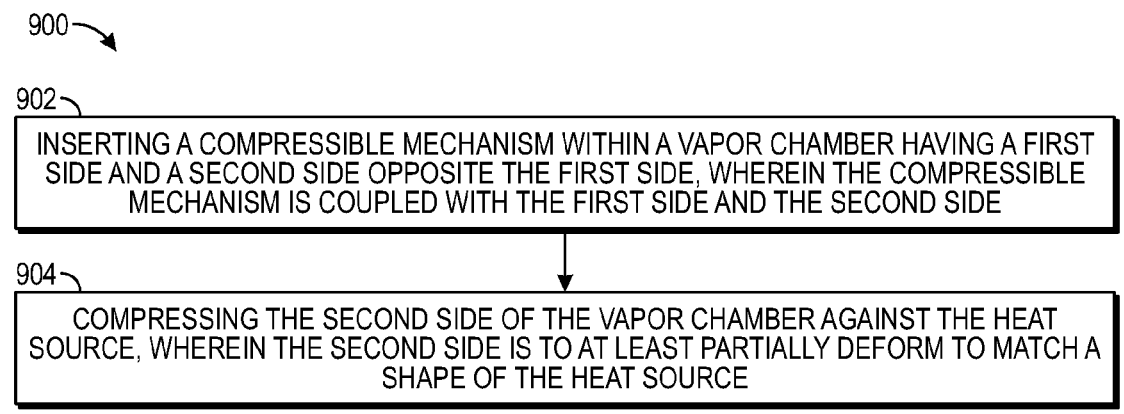
FIG. 9 illustrates an example of a process for manufacturing a package assembly, in accordance with embodiments.

FIG. 9 illustrates an example of a process for manufacturing a package assembly, in accordance with embodiments. Process 900 may be implemented using the features, components, and/or techniques as described in FIGS. 3, 5A-5C, 6, and 7A-7B, At block 902, the process may include inserting a compressible mechanism within a vapor chamber having a first side and a second side opposite the first side, wherein the compressible mechanism is coupled with the first side and the second side. The vapor chamber may be similar to vapor chamber 550 of FIGS. 5A-5C or 750 of FIGS. 7A-7B, the compressible mechanism may be similar to the spring 552 of FIGS. 5A-5C, or 752 of FIGS. 7A-7B.

At block 904, the process may include compressing the second side of the vapor chamber against the heat source, wherein the second side is to at least partially deform to match a shape of the heat source. In embodiments, the second side of the vapor chamber may include vapor chamber bottom 550b of FIGS. 5A-5C, or 750b of FIGS. 7A-7B. The heat source may include the die 304 of FIG. 3, or die 704 of FIGS. 7A-7B. To at least partially deform to match a shape of the heat source may be shown in area 751 of FIG. 7B.

Figure 10:
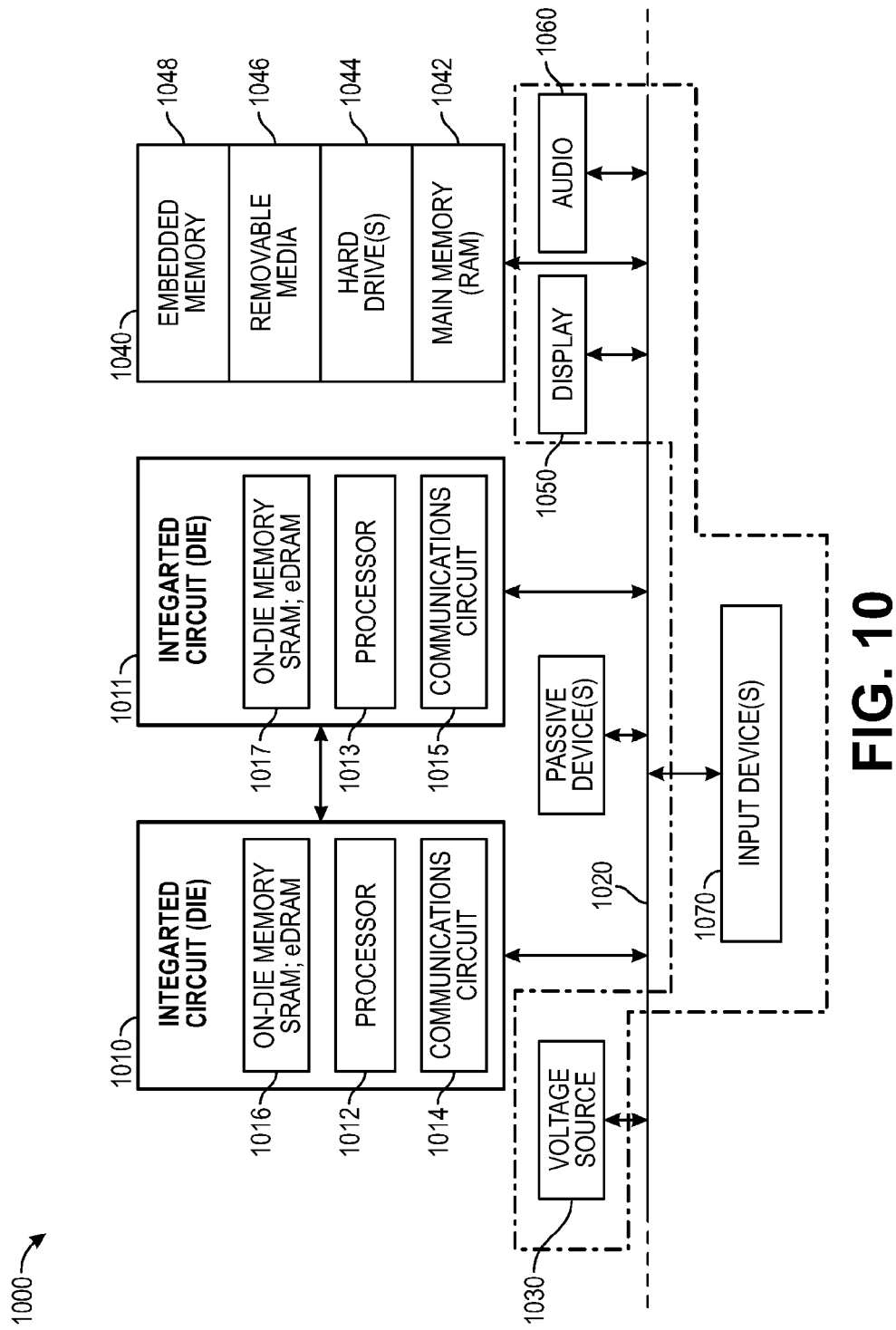
FIG. 10 is a schematic of a computer system 1000, in accordance with an embodiment of the present invention.

FIG. 10 is a schematic of a computer system 1000, in accordance with an embodiment of the present invention. The computer system 1000 (also referred to as the electronic system 1000) as depicted can embody deformed vapor chamber, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a patterned thin film capacitor, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having a patterned thin film capacitor, according to any of the several disclosed embodiments and their equivalents, an electronic system, a computer system, one or more methods of fabricating an integrated circuit, and one or more methods of fabricating an electronic assembly that includes a package substrate having a patterned thin film capacitor, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having patterned thin film capacitor embodiments and their equivalents. A foundation substrate may be included, as represented by the dashed line of FIG. 10. Passive devices may also be included, as is also depicted in FIG. 10.

The following paragraphs describe examples of various embodiments.

Example 1 is an apparatus comprising: a vapor chamber having a first side and a second side opposite the first side, wherein the first side is to thermally couple to a heat sink and the second side is to thermally couple to a heat source; a compressible mechanism disposed within the vapor chamber and coupled with the first side and the second side; wherein the second side, when thermally coupled to the heat source, is to deform at least partially to match a shape of the heat source thermally coupled to the second side: and wherein the compressible mechanism is to moderate the deformation of the second side.

Example 2 may include the apparatus of example 1, wherein the compressible mechanism includes one or more springs.

Example 3 may include the apparatus of example 2, wherein at least one of the one or more springs have a shape of an uppercase omega symbol.

Example 4 may include the apparatus of example 2, wherein the one or more springs are disposed in a pattern to facilitate the moderation of the deformation of the second side of the vapor chamber.

Example 5 may include the apparatus of example 1, further comprising a fastener coupled to the second side of the vapor chamber and the heat source, wherein the fastener is to apply a force to push the second side of the vapor chamber against the heat source.

Example 6 may include the apparatus of example 5, wherein the fastener is adjustable to vary the applied force.

Example 7 may include the apparatus of example 5, further comprising a block disposed within the vapor chamber and coupled with the first side and the second side, wherein the fastener is to couple with the block and with the heat source.

Example 8 may include the apparatus of example, wherein the fastener is to pass through the block.

Example 9 may include the apparatus of example 8, wherein the fastener is a spring screw.

Example 10 may include the apparatus of example 1, wherein the first side is thicker than the second side.

Example 11 may include the apparatus of example 1, wherein the heat source is an integrated circuit (IC) or an application specific integrated circuit (ASIC) package.

Example 12 may be a package comprising: a vapor chamber having a first side and a second side opposite the first side; a compressible mechanism disposed within the vapor chamber coupled with the first side and the second side; a heatsink thermally coupled with the first side of the vapor chamber; a heat source thermally coupled with the second side of the vapor chamber, wherein the second side is at least partially deformed to match a shape of the heat source thermally coupled to the second side, and wherein the compressible mechanism is to mitigate the deformation.

Example 13 may include the package of example 12, wherein the compressible mechanism includes one or more springs.

Example 14 may include the package of example 13, wherein the one or more springs are laid out in a pattern to facilitate the moderation of the deformation of the second side of the vapor chamber.

Example 15 may include the package of example 12, further comprising a fastener coupled to the second side of the chamber and the heat source, wherein the fastener is to apply and/or maintain a force to push the second side of the vapor chamber against the heat source.

Example 16 may include the package of example 15, further comprising a block disposed within the vapor chamber and coupled with the first side and the second side, wherein the fastener is to couple with the block and with the heat source.

Example 17 may include the package of example 16, wherein the fastener is to pass through the block.

Example 18 may include a method comprising: inserting a compressible mechanism within a vapor chamber having a first side and a second side opposite the first side, wherein the compressible mechanism is coupled with the first side and the second side; compressing the second side of the vapor chamber against the heat source, wherein the second side is to at least partially deformed to match a shape of the heat source.

Example 19 may include the method of example 18, wherein compressing the second side of the vapor chamber against the heat source further comprises: installing a fastener to the vapor chamber and to the heat source; and tightening the fastener.

Example 20 may include the method of example 19, wherein the fastener is a spring screw; and wherein tightening the fastener further includes tightening the spring screw.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
    a vapor chamber having a first side and a second side opposite the first side, wherein the first side thermally and physically couples to a heat sink and the second side is to thermally and physically couple to a heat source;
    a compressible mechanism disposed within the vapor chamber and physically coupled with the first side and the second side;
    a fastener coupled with the second side of the vapor chamber that is to couple with the heat source, wherein the fastener applies a force to push the second side of the vapor chamber against the heat source and deforms the second side of the vapor chamber at least partially to match a shape of the heat source; and
    wherein the compressible mechanism moderates the deformation of the second side of the vapor chamber.

2. The apparatus of claim 1, wherein the compressible mechanism includes one or more springs.

3. The apparatus of claim 2, wherein at least one of the one or more springs have a shape of an uppercase omega symbol.

4. The apparatus of claim 2, wherein the one or more springs are disposed in a pattern to facilitate the moderation of the deformation of the second side of the vapor chamber.

5. The apparatus of claim 1, wherein the fastener is adjustable to vary the applied force.

6. The apparatus of claim 1, further comprising a block disposed within the vapor chamber and coupled with the first side and the second side, wherein the fastener is to couple with the block and with the heat source.

7. The apparatus of claim 6, wherein the fastener is to pass through the block.

8. The apparatus of claim 7, wherein the fastener is a spring screw.

9. The apparatus of claim 1, wherein the first side is thicker than the second side.

10. The apparatus of claim 1, wherein the heat source is an integrated circuit (IC) or an application specific integrated circuit (ASIC) package.

11. A package comprising:
    a vapor chamber having a first side and a second side opposite the first side;
    a compressible mechanism disposed within the vapor chamber coupled with the first side and the second side;
    a heatsink thermally coupled with the first side of the vapor chamber;
    a heat source thermally coupled with the second side of the vapor chamber, wherein the second side is at least partially deformed to match a shape of the heat source thermally coupled to the second side, and wherein the compressible mechanism is to mitigate the deformation; and a fastener coupled with the second side of the vapor chamber and with the heat source, wherein the fastener applies a force to push the second side of the vapor chamber against the heat source to deform the second side of the vapor chamber.

12. The package of claim 11, wherein the compressible mechanism includes one or more springs.

13. The package of claim 12, wherein the one or more springs are laid out in a pattern to facilitate the moderation of the deformation of the second side of the vapor chamber.

14. The package of claim 11, further comprising a block disposed within the vapor chamber and coupled with the first side and the second side, wherein the fastener is to couple with the block and with the heat source.

15. The package of claim 14, wherein the fastener is to pass through the block.

16. A method comprising:
inserting a compressible mechanism within a vapor chamber having a first side and a second side opposite the first side, wherein the compressible mechanism is coupled with the first side and the second side, wherein the compressible mechanism includes at least one spring in a shape of an uppercase omega symbol;
compressing the second side of the vapor chamber against the heat source, wherein the second side at least partially deforms to match a shape of the heat source.

17. The method of claim 16, wherein compressing the second side of the vapor chamber against the heat source further comprises:
installing a fastener to the vapor chamber and to the heat source; and
tightening the fastener.

18. The method of claim 17, wherein the fastener includes a spring screw; and
wherein tightening the fastener further includes tightening the spring screw.

19. An apparatus comprising:
a vapor chamber having a first side and a second side opposite the first side, wherein the first side thermally and physically couples to a heat sink and the second side is to thermally and physically couple to a heat source;
a compressible mechanism disposed within the vapor chamber and physically coupled with the first side and the second side;
wherein the second side, when thermally coupled to the heat source, deforms at least partially to match a shape of the heat source; and
wherein the compressible mechanism includes at least one spring in a shape of an uppercase omega symbol, and wherein the at least one spring moderates the deformation of the second side.

* * * * *